(12) United States Patent
Ito et al.

(10) Patent No.: US 10,533,065 B2
(45) Date of Patent: Jan. 14, 2020

(54) PHOTOCURABLE COMPOSITION, METHOD FOR PRODUCING CURED PRODUCT PATTERN USING THE SAME, METHOD FOR PRODUCING OPTICAL COMPONENT, AND METHOD FOR PRODUCING CIRCUIT BOARD

(71) Applicant: CANON KABUSHIKI KAISHA, Tokyo (JP)

(72) Inventors: Toshiki Ito, Kawasaki (JP); Takeshi Honma, Tokyo (JP); Shiori Yonezawa, Tokyo (JP); Tomonori Otani, Kawasaki (JP); Kazumi Iwashita, Kobe (JP)

(73) Assignee: Canon Kabushiki Kaisha, Tokyo (JP)

( * ) Notice: Subject to any disclaimer, the term of this patent is extended or adjusted under 35 U.S.C. 154(b) by 333 days.

(21) Appl. No.: 15/328,394

(22) PCT Filed: Jul. 22, 2015

(86) PCT No.: PCT/JP2015/003671
§ 371 (c)(1),
(2) Date: Jan. 23, 2017

(87) PCT Pub. No.: WO2016/013216
PCT Pub. Date: Jan. 28, 2016

(65) Prior Publication Data
US 2017/0210837 A1    Jul. 27, 2017

(30) Foreign Application Priority Data

Jul. 25, 2014   (JP) .................. 2014-151499

(51) Int. Cl.
| | |
|---|---|
| *C08F 2/48* | (2006.01) |
| *C08F 2/46* | (2006.01) |
| *H01F 41/00* | (2006.01) |
| *C08F 220/18* | (2006.01) |
| *C08F 222/10* | (2006.01) |
| *G03F 7/00* | (2006.01) |
| *G03F 7/027* | (2006.01) |
| *G03F 7/029* | (2006.01) |
| *B05D 3/06* | (2006.01) |
| *B05D 3/12* | (2006.01) |
| *G02B 1/04* | (2006.01) |
| *H01L 21/027* | (2006.01) |
| *H01L 21/48* | (2006.01) |
| *H05K 3/06* | (2006.01) |

(52) U.S. Cl.
CPC ............. *C08F 220/18* (2013.01); *B05D 3/06* (2013.01); *B05D 3/12* (2013.01); *C08F 2/48* (2013.01); *C08F 222/10* (2013.01); *C08F 222/1006* (2013.01); *G02B 1/04* (2013.01); *G03F 7/0002* (2013.01); *G03F 7/027* (2013.01); *G03F 7/029* (2013.01); *H01L 21/0273* (2013.01); *H01L 21/4846* (2013.01); *H05K 3/06* (2013.01); *H05K 3/064* (2013.01); *C08F 2222/102* (2013.01); *H01L 21/0274* (2013.01)

(58) Field of Classification Search
CPC .............. C08F 220/18; C08F 2222/102; C08F 222/1006; B05D 3/06; B05D 3/12; H01L 21/0273; H01L 21/4846; G03F 7/002; G03F 7/0029; H05K 3/06; H05K 3/064
USPC .......................................... 427/508, 487, 457
See application file for complete search history.

(56) References Cited

U.S. PATENT DOCUMENTS

| | | | |
|---|---|---|---|
| 4,323,636 | A | 4/1982 | Chen |
| 4,414,278 | A | 11/1983 | Cohen |
| 4,423,135 | A | 12/1983 | Chen et al. |
| 2007/0065757 | A1 | 3/2007 | Ogino |

(Continued)

FOREIGN PATENT DOCUMENTS

| | | |
|---|---|---|
| CN | 1977221 A | 6/2007 |
| CN | 101116035 A | 1/2008 |

(Continued)

OTHER PUBLICATIONS

Yu, L. et al., "Photosensitive Cross-linked Block Copolymers with Controllable Release," Photochembiology and Photobiology, vol. 87, No. 3, pp. 646-652. Feb. 10, 2011.

*Primary Examiner* — Jessica Whiteley
(74) *Attorney, Agent, or Firm* — Canon U.S.A. Inc., IP Division (57) ABSTRACT

A photocurable composition contains a polymerizable compound; and a photopolymerization initiator, in which
the photocurable composition contains a compound represented by General Formula (1) shown below as the polymerizable compound,
and in which, in General Formula (1), Ar represents a monovalent aromatic group which may have a substituent, $R_1$ represents an alkyl group which may have a substituent or a hydrogen atom, $R_2$ represents an alkyl group having (m+n) valences which may have a substituent, m is an integer of 2 or more, and n is an integer of 1 or more.

[Chem. 1]

$$(Ar)_n - R_2 \left( -O - \overset{R_1}{\underset{\|\,O}{C}} = CH_2 \right)_m \quad (1)$$

21 Claims, 1 Drawing Sheet

(56) References Cited

U.S. PATENT DOCUMENTS

| | | | | |
|---|---|---|---|---|
| 2011/0287274 A1* | 11/2011 | Mijolovic | ............... | C07C 69/54 428/521 |
| 2016/0137769 A1* | 5/2016 | Kwack | .................... | C07C 69/54 257/40 |
| 2016/0187774 A1* | 6/2016 | Ito | ......................... | G03F 7/0002 29/848 |
| 2018/0017861 A1* | 1/2018 | Iwashita | .................... | C08F 2/48 |

FOREIGN PATENT DOCUMENTS

| | | |
|---|---|---|
| CN | 101620376 A | 1/2010 |
| CN | 102911052 A | 2/2013 |
| CN | 103113900 A | 5/2013 |
| JP | S51-043374 B | 11/1976 |
| JP | 2010-073811 A | 4/2010 |
| JP | 2010-106062 A | 5/2010 |
| JP | 2011-159881 A | 8/2011 |
| JP | 2012-072269 A | 4/2012 |
| JP | 2013-062489 A | 4/2013 |
| JP | 2013-149884 A | 8/2013 |
| JP | 2013-170227 A | 9/2013 |
| JP | 2013-189537 A | 9/2013 |
| JP | 2013-538239 A | 10/2013 |
| JP | 2014-075577 A | 4/2014 |
| JP | 2014-078697 A | 5/2014 |
| JP | 2014-237632 A | 12/2014 |
| TW | 201038596 A | 11/2010 |
| TW | 201424996 A | 7/2014 |
| TW | 201443000 A | 11/2014 |
| WO | 2010/064534 A1 | 5/2012 |
| WO | 2013/094390 A1 | 6/2013 |
| WO | 2013/162049 A1 | 10/2013 |
| WO | 2014/046304 A1 | 3/2014 |
| WO | 2014/181533 A1 | 11/2014 |
| WO | 2015/030151 A1 | 3/2015 |
| WO | 2015/041154 A1 | 3/2015 |

* cited by examiner

FIG. 1A  STEP [1]

FIG. 1B  STEP [2]

FIG. 1C  STEP [3]

FIG. 1D  STEP [4]

FIG. 1E  STEP [5]

FIG. 1F  STEP [6]

FIG. 1G  STEP [7]

PHOTOCURABLE COMPOSITION, METHOD FOR PRODUCING CURED PRODUCT PATTERN USING THE SAME, METHOD FOR PRODUCING OPTICAL COMPONENT, AND METHOD FOR PRODUCING CIRCUIT BOARD

CROSS-REFERENCE TO RELATED APPLICATIONS

This application is a National Stage filing of International Application No. PCT/JP2015/003671 filed Jul. 22, 2015, which claims the benefit of Japanese Patent Application No. 2014-151499, filed Jul. 25, 2014, the disclosures of each of which are hereby incorporated by reference herein in their entirety.

TECHNICAL FIELD

The present invention relates to a photocurable composition, a method for producing a cured product pattern using the same, a method for producing an optical component, a method for producing a circuit board, and the like.

BACKGROUND ART

A semiconductor device, MEMS, and the like have been increasingly demanded to reduce the size, and, under the circumstances, a photo-nanoimprinting technique has drawn attention.

According to the photo-nanoimprinting technique, a photocurable composition (resist) is cured in a state where a mold (pattern) on the surface of which a fine irregular pattern is formed is pressed against a substrate (wafer) to which the photocurable composition is applied. Thus, the irregular pattern of the mold is transferred to a cured product of the photocurable composition, and then the pattern is formed on the substrate. According to the photo-nanoimprinting technique, a fine structure of a several nanometer order can be formed on a substrate.

According to the photo-nanoimprinting technique, a resist is first applied to a pattern formation region on a substrate (disposing process). Next, the resist is molded using a mold on which a pattern is formed (pattern contact process). Then, light is emitted to cure the resist (light irradiation process), and then the resist is released (mold release process). By carrying out these processes, the pattern (photocured film) of resin having a predetermined shape is formed on the substrate.

The cured product pattern formed on the substrate by the photo-nanoimprinting technique may be utilized as a mask in processing a ground substrate using a dry etching technique. In this case, in order to process the ground substrate with a good yield, the photocurable composition has been demanded to have high dry etching resistance.

The dry etching resistance of the photocurable composition is dominantly determined by a polymerizable compound composition in the photocurable composition. On the other hand, the viscosity of the photocurable composition is also dominantly determined by the polymerizable compound composition of the photocurable composition.

When the viscosity of the photocurable composition is high, the speed at which the composition spreads on the substrate after applying the composition onto the substrate and the speed at which the composition is charged into concave portions of a fine pattern formed on a mold after bringing the composition into contact with the mold are low.

Therefore, when the viscosity of the photocurable composition is high, the charging speed of the composition is low and also the productivity in forming a cured product pattern by the photo-nanoimprinting technique is low.

CITATION LIST

Patent Literature

PTL 1: Japanese Patent Laid-Open No. 2010-073811

SUMMARY OF INVENTION

Then, the present invention provides a photocurable composition having a high charging speed and high dry etching resistance.

The present invention relates to a photocurable composition containing a polymerizable compound; and a photopolymerization initiator, in which the photocurable composition contains a compound represented by General Formula (1) shown below as the polymerizable compound

[Chem. 1]

and in which, in General Formula (1), Ar represents a monovalent aromatic group which may have a substituent, $R_1$ represents an alkyl group which may have a substituent or a hydrogen atom, $R_2$ represents an alkyl group having (m+n) valences which may have a substituent, m is an integer of 2 or more, and n is an integer of 1 or more.

Further features of the present invention will become apparent from the following description of exemplary embodiments with reference to the attached drawings.

DESCRIPTION OF EMBODIMENT

Hereinafter, an embodiment of the present invention is described in detail referring to the drawings as appropriate.

However, the present invention is not limited to the embodiment described below. Moreover, in the present invention, an embodiment in which the embodiment described below is altered and improved as appropriate without deviating from the scope of the present invention based on general knowledge of persons skilled in the art is also included in the scope of the present invention.

Photocurable Composition

The photocurable composition according to this embodiment is a photocurable composition containing a component (A) which is a polymerizable compound and a component (B) which is a photopolymerization initiator. The photocurable composition according to this embodiment can be suitably used as a photocurable composition for nanoimprinting.

In this specification, a "cured product" refers to a product obtained by polymerizing the polymerizable compound contained in the photocurable composition, and then partially or completely curing the polymerized compound. Among the cured products, when emphasizing that the thickness is extremely small as compared with the area, the cured product is sometimes referred to as a "cured film" in a particular case. The shape of the cured product and the cured film are not particularly limited and may have a pattern shape on the surface.

First, each component is described in detail.

Component (A): Polymerizable Compound

The component (A) is a polymerizable compound. Herein, in this specification, the polymerizable compound is a compound which reacts with a polymerizing factor (radical and the like) generated from the photopolymerization initiator (component (B)) to form a film containing a high molecular weight compound by a chain reaction (polymerization reaction).

As such a polymerizable compound, a radical polymerizable compound is mentioned, for example. The polymerizable compound which is the component (A) may contain only one kind of a polymerizable compound or may contain two or more kinds of polymerizable compounds.

The radical polymerizable compound is suitably a compound having one or more acryloyl groups or methacryloyl groups, i.e., a (meth)acryl compound.

Therefore, it is suitable for the polymerizable compound which is the component (A) of the photocurable composition to contain a (meth)acryl compound. It is more suitable that the main component of the component (A) is more suitably a (meth)acryl compound and it is most suitable that the component (A) is a (meth)acryl compound. The description that the main component of the component (A) is a (meth)acryl compound herein refers to the fact that the component (A) contains 90% by weight or more of a (meth)acryl compound.

When the radical polymerizable compound contains two or more kinds of compounds containing one or more acryloyl groups or methacryloyl groups, it is suitable that a monofunctional (meth)acryl monomer and a polyfunctional (meth)acryl monomer are contained. This is because, by combining the monofunctional (meth)acryl monomer and the polyfunctional (meth)acryl monomer, a cured film with high mechanical strength is obtained.

The photocurable composition according to this embodiment contains a polyfunctional (meth)acryl monomer represented by the following general formula (1) as the polymerizable compound.

[Chem. 2]

In General Formula (2), Ar represents a monovalent aromatic group which may have a substituent, $R_1$ represents an alkyl group which may have a substituent or a hydrogen atom, $R_2$ represents an alkyl group having (m+n) valences which may have a substituent m is an integer of 2 or more, and n is an integer of 1 or more.

m is suitably an integer of 2 or more and 4 or less and n is suitably an integer of 1 or more and 4 or less.

The polyfunctional (meth)acryl monomer represented by General Formula (1) above has low viscosity. In a pattern contact process described later, when the viscosity of the photocurable composition is lower, the speed at which the photocurable composition is charged into concave portions forming a fine pattern on a mold is higher. More specifically, the photocurable composition according to this embodiment containing the polyfunctional (meth)acryl monomer represented by General Formula (1) above as the polymerizable compound is charged into the mold at a high charging speed. The cured film of the photocurable composition according to this embodiment containing the polyfunctional (meth)acryl monomer represented by General Formula (1) above as the polymerizable compound has high dry etching resistance.

As an example of the polyfunctional (meth)acryl monomer represented by General Formula (1) above, phenylethylene glycol diacrylate (PhEDA) represented by the following general formula (2) and 2-phenylpropane-1,3-diyldiacrylate (PhPDA) represented by the following general formula (3) are mentioned, for example.

[Chem. 3]

[Chem. 4]

PhEDA can be synthesized according to a synthesis scheme as shown in the following general formula (4), for example.

[Chem. 5]

(4)

PhPDA can be synthesized by a synthesis scheme as shown in the following general formula (5), for example.

[Chem. 6]

(5)

The photocurable composition according to this embodiment may contain compounds other than the polyfunctional (meth)acryl monomer represented by General Formula (1) above as the component (A) which is the polymerizable compound.

For example, the photocurable composition according to this embodiment may contain a monofunctional (meth)acryl compound containing an acryloyl group or one methacryloyl group as the component (A). Examples of the monofunctional (meth)acryl compound include, for example, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenyl phenyl)-2-hydroxypropyl (meth)acrylate, (meth) acrylate of EO-modified p-cumylphenol, 2-bromophenoxyethyl (meth)acrylate, 2, 4-dibromophenoxyethyl (meth) acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth) acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth) acrylate, isobutyl (meth)acrylate, t-butyl (meth)acrylate, pentyl (meth)acrylate, isoamyl (meth)acrylate, hexyl (meth) acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth) acrylate, benzyl (meth)acrylate, tetrahydrofurfuryl (meth) acrylate, butoxyethyl (meth)acrylate, ethoxy diethylene glycol (meth)acrylate, polyethylene glycol mono(meth) acrylate, polypropylene glycol mono(meth)acrylate, methoxy ethylene glycol (meth)acrylate, ethoxyethyl (meth) acrylate, methoxy polyethylene glycol (meth)acrylate, methoxy polypropylene glycol (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethyl aminoethyl (meth)acrylate, 7-amino-3,7-dimethyloctyl (meth)acrylate, N,N-diethyl (meth)acrylamide, N,N-dimethyl aminopropyl (meth)acrylamide, and the like but the compound is not limited thereto.

Examples of commercially-available items of the monofunctional (meth)acryl compounds mentioned above include Aronix M101, M102, M110, M111, M113, M117, M5700, TO-1317, M120, M150, and M156 (manufactured by Toagosei Co., Ltd.), MEDOL10, MIBDOL10, CHDOL10, MMDOL30, MEDOL30, MIBDOL30, CHDOL30, LA, IBXA, 2-MTA, HPA, and Biscoat #150, #155, #158, #190, #192, #193, #220, #2000, #2100, and #2150 (manufactured by Osaka Organic Chemical Industry Co., Ltd.), Light Acrylate BO-A, EC-A, DMP-A, THF-A, HOP-A, HOA-MPE, HOA-MPL, PO-A, P-200A, NP-4EA, and NP-8EA, and Epoxy Ester M-600A (manufactured by Kyoeisha Chemical Co., Ltd.), Kayarad TC110S, R-564, and R128H (manufactured by Nippon Kayaku Co., Ltd.), NK ester AMP-10G and AMP-20G (manufactured by Shin-Nakamura Chemical make), FA-511A, 512A, and 513A (manufactured by Hitachi Chemical Co., Ltd.), PHE, CEA, PHE-2, PHE-4, BR-31, BR-31M, and BR-32 (manufactured by Daiichi Kogyo Seiyaku Co., Ltd.), VP (manufactured by BASF), ACMO, DMAA, and DMAPAA (manufactured by Kohjin), and the like but the commercially-available items of the monofunctional (meth)acryl compounds are not limited thereto.

The photocurable composition according to this embodiment may further contain a polyfunctional (meth)acryl compound containing two or more acryloyl groups or methacryloyl groups as the component (A). Examples of the polyfunctional (meth)acryl compound include, for example, trimethylol propane di(meth)acrylate, trimethylol propane tri(meth)acrylate, EO-modified trimethylol propane tri (meth)acrylate, PO-modified trimethylol propane tri(meth) acrylate. EO,PO-modified trimethylol propane tri(meth) acrylate, dimethylol tricyclodecane di(meth)acrylate, pentaerythritol tri(meth)acrylate, pentaerythritol tetra(meth) acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, 1,9-nonanediol di(meth)acrylate, 1, 10-decanediol di(meth)acrylate, 1,3-adamantane dimethanol di(meth)acrylate, tris(2-hydroxyethyl)isocyanurate tri(meth)acrylate, tris(acryloyloxy)isocyanurate, bis(hydroxymethyl) tricyclodecane di(meth)acrylate, dipentaerythritol penta(meth)acrylate, dipentaerythritol hexa(meth)acrylate, EO-modified 2,2-bis(4-((meth)acryloxy) phenyl)propane, PO-modified 2,2-bis(4-((meth)acryloxy) phenyl)propane, EO,PO-modified 2,2-bis(4-((meth) acryloxy)phenyl)propane, and the like but the polyfunctional (meth)acryl compound is not limited thereto.

Examples of commercially-available items of the polyfunctional (meth)acryl compounds include Yupimer UV SA1002 and SA2007 (manufactured by Mitsubishi Chemical Corporation), Viscoat #195, #230, #215, #260, #335HP, #295, #300, #360, #700, GPT, and 3PA manufactured by Osaka Organic Chemical Industry Co., Ltd.), Light Acrylate 4EG-A, 9EG-A, NP-A, DCP-A, BP-4EA, BP-4PA, TMP-A, PE-3A, PE-4A, and DPE-6A (manufactured by Kyoeisha Chemical Co., Ltd.), Kayarad PET-30, TMPTA, R-604, DPHA, DPCA-20, -30, -60, -120, HX-620, D-310, and D-330 (manufactured by Nippon Kayaku Co., Ltd.), Aronix M208, M210, M215, M220, M240, M305, M309, M310, M315, M325, and M400 (manufactured by Toagosei Co., Ltd.), Ripoxy VR-77, VR-60, VR-90 (manufactured by Showa Kobunshi), and the like but the commercially-available items of the polyfunctional (meth)acryl compounds are not limited thereto.

In the compound groups mentioned above, the (meth) acrylate refers to acrylate or methacrylate having an alcohol residue equivalent thereto. The (meth)acryloyl group refers to an acryloyl group or a methacryloyl group having an alcohol residue equivalent thereto. The EO represents ethyleneoxide and the EO-modified compound A represents a compound in which a (meth)acrylate residue and an alcohol residue of the compound A are bonded through the block structure of the ethyleneoxide group. The PO represents propylene oxide and the PO-modified compound B represents a compound in which a (meth)acrylate residue and an alcohol residue of the compound B are bonded through the block structure of the propylene oxide group.

Component (B): Photopolymerization Initiator

The component (B) is a photopolymerization initiator.

In this specification, the photopolymerization initiator is a compound which detects light of a predetermined wavelength, and then generates the polymerizing factor (radical). Specifically, the photopolymerization initiator is a polymerization initiator (radical generating agent) which generates a radical by light (radiation rays, such as infrared rays, visible light, ultraviolet rays, far ultraviolet rays, X-rays, and charged particle rays, such as electron beams).

The component (B) may contain one kind of a photopolymerization initiator or may contain two or more kinds of photopolymerization initiators.

Examples of the radical generating agent include, for example, 2,4,5-triaryl imidazole dimers which may have a substituent, such as 2-(o-chlorophenyl)-4,5-diphenyl imidazole dimer, 2-(o-chlorophenyl)-4,5-di(methoxyphenyl)imidazole dimer, 2-(o-fluoro phenyl)-4,5-diphenyl imidazole dimer, and 2-(o- or p-methoxy phenyl)-4,5-diphenyl imidazole dimer; benzophenone derivatives, such as benzophenone, N,N'-tetramethyl-4,4'-diaminobenzophenone (Michler's Ketone), N,N-tetraethyl-4,4'-diaminobenzophenone, 4-methoxy-4'-dimethylamino benzophenone, 4-chlorobenzophenone, 4,4'-dimethoxybenzophenone, and 4,4'-diaminobenzophenone; α-amino aromatic ketone derivatives, such as 2-benzyl-2-dimethylamino-1-(4-morpholinophenyl)-butanone-1,2-methyl-1-[4-(methyl thio)phenyl]-2-morpholino-propane-1-on; quinones, such as 2-ethylanthraquinone, phenanthrenequinone, 2-t-butylanthraquinone, octamethyl anthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethyl anthraquinone; benzoin ether derivatives, such as benzoin methyl ether, benzoin ethyl ether, and benzoin phenyl ether; benzoin derivatives, such as benzoin, methyl benzoin, ethyl benzoin, and propyl benzoin; benzyl derivatives, such as benzyl dimethyl ketal; acridine derivatives, such as 9-phenyl acridine and 1,7-bis(9,9'-acridinyl)heptane; N-phenylglycine derivatives, such as N-phenylglycine; acetophenone derivatives, such as acetophenone, 3-methyl acetophenone, acetophenone benzyl ketal, 1-hydroxy cyclohexyl phenyl ketone, and 2,2-dimethoxy-2-phenyl acetophenone; thioxanthone derivatives, such as thioxanthone, diethyl thioxanthone, 2-isopropyl thioxanthone, and 2,2-chlorothioxanthone; acyl phosphine oxide derivatives, such as 2,4,6-trimethyl benzoyl diphenyl phosphine oxide, bis(2,4,6-trimethyl benzoyl) phenyl phosphine oxide, and bis-(2,6-dimethoxy benzoyl)-2,4, 4-trimethyl pentyl phosphine oxide; oxime ester derivatives, such as 1,2-octanedione, I-[4-(phenylthio)-,2-(O-benzoyloxime)], ethanone, 1-[9-ethyl-6-(2-methyl benzoyl)-9H-carbazole-3-yl]-1-(O-acetyloxime); xanthone, fluorenone, benzaldehyde, fluorene, anthraquinone, triphenylamine, carbazole, 1-(4-isopropyl phenyl)-2-hydroxy-2-methyl propane-1-on, 2-hydroxy-2-methyl-1-phenylpropane-1-on, and the like but the radical generating agent is not limited thereto.

Examples of commercially-available items of the radical generating agents include Irgacure184, 369, 651, 500, 819, 907, 784, 2959, CGI-1700, -1750, -1850, and CG24-61, Darocur 1116 and 1173, Lucirin TPO LR8893 and LR8970 (manufactured by BASF). Uvecryl P36 (manufactured by UCB), and the like but the commercially-available items of the radical generating agents are not limited thereto.

Among the above, the component (B) is suitably an acyl phosphine oxide polymerization initiator. Among the examples above, examples of the acyl phosphine oxide polymerization initiator include acyl phosphine oxide compounds, such as 2,4,6-trimethyl benzoyl diphenyl phosphine oxide, bis(2,4,6-trimethyl benzoyl)phenyl phosphine oxide, and bis(2,6-dimethoxy benzoyl)-2,4,4-trimethyl pentyl phosphine oxide.

The blending ratio of the component (B) which is the photopolymerization initiator in the photocurable composition is 0.01% by weight or more and 10% by weight or less and suitably 0.1% by weight or more and 7% by weight or less based on the total amount of the component (A) which is the polymerizable compound.

By setting the blending ratio of the component (B) to 0.01% by weight or more based on the total amount of the polymerizable compound, the curing rate of the composition becomes higher, so that the reaction efficiency can be improved. Moreover, by setting the blending ratio of the component (B) to 10% by weight or less based on the total amount of the polymerizable compound, the cured film to be obtained is a cured film having a certain degree of mechanical strength.

Other Additives (C)

The photocurable composition according to this embodiment may further contain additives (C) in addition to the component (A) and the component (B) mentioned above according to various purposes in a range where the effects of the present invention are not impaired. Examples of such additives (C) include sensitizers, hydrogen donors, internal mold release agents, surfactants, antioxidants, solvents, polymer components, polymerization initiators which are not the components (B) mentioned above, and the like.

The sensitizer is a compound to be added as appropriate for the purpose of accelerating a polymerization reaction and improving a reaction conversion rate. As the sensitizers, a sensitizing dye and the like are mentioned, for example.

The sensitizing dye is a compound which is excited by absorbing light of a specific wavelength, and interacts with the photopolymerization initiator which is the component (B). The interaction described herein refers to energy transfer, electron transfer, and the like from the sensitizing dye in the excited state to the photopolymerization initiator which is the component (B).

Specific examples of the sensitizing dye include an anthracene derivative, an anthraquinone derivative, a pyrene derivative, a perylene derivative, a carbazole derivative, a benzophenone derivative, a thioxanthone derivative, a xanthone derivative, a coumarin derivative, a phenothiazine derivative, a camphorquinone derivative, an acridine pigment, a thiopyrylium salt pigment, a merocyanine pigment, a quinoline pigment, a styrylquinoline pigment, a ketocoumarin pigment, a thioxanthene pigment, a xanthene pigment, an oxonol pigment, a cyanine pigment, a rhodamine pigment, a pyrylium salt pigment, and the like but the sensitizing dye is not limited thereto.

The sensitizers may be used alone or as a mixture of two or more kinds thereof.

The hydrogen donor is a compound which reacts with an initiating radical generated from the photopolymerization initiator which is the component (B) and a radical at a polymerization growth terminal, and then generates a radical with higher reactivity. It is suitable to add the hydrogen donor when the photopolymerization initiator which is the component (B) is a photoradical generating agent.

Specific examples of such a hydrogen donor include amine compounds, such as n-butylamine, di-n-butylamine, tri-n-butylphosphine, allylthio urea, s-benzyl isothiuronium-p-toluene sulfinate, triethylamine, diethylaminoethyl methacrylate, triethylene tetramine, 4,4'-bis(dialkylamino)benzophenone. N,N-dimethylaminobenzoic acid ethyl ester, N,N-dimethylaminobenzoic acid isoamyl ester, pentyl-4-dimethylamino benzoate, triethanolamine, and N-phenylglycine, mercapto compounds, such as 2-mercapto-N-phenyl benzimidazole and mercaptopropionic acid ester, and the like but the hydrogen donor is not limited thereto.

The hydrogen donors may be used alone or as a mixture of two or more kinds thereof. The hydrogen donor may have a function as the sensitizer.

When the curable composition according to this embodiment contains the sensitizer and the hydrogen donor as the additives (C), the content of the additives each is preferably 0% by weight or more and 20% by weight or less based on the total amount of the component (A) which is the polymerizable compound. The content is more preferably 0.1% by weight or more and 5.0% by weight or less and still more preferably 0.2% by weight or more and 2.0% by weight or less. When 0.1% by weight or more of the sensitizer is contained based on the total amount of the component (A), a polymerization acceleration effect can be more effectively demonstrated. By setting the content of the sensitizer and the hydrogen donor to 5.0% by weight or less, the molecular weight of a high molecular weight compound configuring a photocured film to be produced becomes sufficiently high and also poor dissolution in the photocurable composition and degradation of the storage stability of the photocurable composition can be suppressed.

The internal mold release agent can be added to the photocurable composition for the purpose of reducing the interface bonding force between a mold and a resist. i.e., reducing mold releasing force in a mold release process described later. In this specification, the "internal" means that the agent is added to the photocurable composition in advance before the disposing process of the photocurable composition.

As the internal mold release agent, surfactants, such as silicone based surfactants, fluorine based surfactants, and hydrocarbon based surfactants, and the like can be used. In the present invention, the internal mold release agent does not have polymerizability.

Examples of the fluorine based surfactants include polyalkylene oxide (polyethylene oxide, polypropylene oxide, and the like) adducts of alcohol having a perfluoroalkyl group, polyalkylene oxide (polyethylene oxide, polypropylene oxide, and the like) adducts of perfluoropolyether, and the like. The fluorine based surfactants may have a hydroxyl group, an alkoxy group, an alkyl group, an amino group, a thiol group, and the like in a part of the molecular structure (for example, terminal group).

As the fluorine based surfactants, commercially-available items may be used. Examples of the commercially-available items of the fluorine based surfactants include, for example. Megafac F-444, TF-2066, TF-2067, and TF-2068 (manufactured by DIC). Fluorad FC-430 and FC-431 (manufactured by Sumitomo 3M), SURFLON S-382 (manufactured by AGC CO., LTD.), EFTOP EF-122A, 122B, 122C, EF-121, EF-126, EF-127, and MF-100 (manufactured by Tokem Products Co., Ltd.). PF-636, PF-6320, PF-656, and PF-6520 (manufactured by OMNOVA Solutions, Inc.), UNIDYNE DS-401, DS-403, and DS-451 (manufactured by DAIKIN INDUSTRIES, LTD). Ftergent 250, 251, 222F, and 208G (manufactured by Neos).

The internal mold release agents may be hydrocarbon based surfactants.

Examples of the hydrocarbon based surfactants include alkyl alcohol polyalkylene oxide adducts in which alkylene oxide having 2 to 4 carbon atoms is added to alkyl alcohol having 1 to 50 carbon atoms and the like.

Examples of the alkyl alcohol polyalkylene oxide adducts include a methyl alcohol ethylene oxide adduct, a decyl alcohol ethylene oxide adduct, a lauryl alcohol ethylene oxide adduct, a cetyl alcohol ethylene oxide adduct, a stearyl alcohol ethylene oxide adduct, a stearyl alcohol ethylene oxide/propylene oxide adduct, and the like. A terminal group of the alkyl alcohol polyalkylene oxide adduct is not limited to a hydroxyl group which can be produced simply by adding polyalkylene oxide to alkyl alcohol. The hydroxyl group may be replaced by other substituents, e.g., polar functional groups, such as a carboxyl group, an amino group, a pyridyl group, a thiol group, and a silanol group, and hydrophobic functional groups, such as an alkyl group and an alkoxy group.

As the alkyl alcohol polyalkylene oxide adduct, commercially-available items may be used. Examples of the commercially-available items of the alkyl alcohol polyalkylene oxide adduct include, for example, polyoxy ethylene methyl ether manufactured by AOKI OIL INDUSTRIAL Co., LTD. (methyl alcohol ethylene oxide adduct) (BLAUNON MP-400, MP-550, and MP-1000), polyoxy ethylene decyl ether manufactured by AOKI OIL INDUSTRIAL Co., LTD. (decyl alcohol ethylene oxide adduct) (FINESURF D-1303, D-1305, D-1307, and D-1310), polyoxy ethylene lauryl ether manufactured by AOKI OIL INDUSTRIAL Co., LTD. (lauryl alcohol ethylene oxide adduct) (BLAUNON EL-1505), polyoxy ethylene cetyl ether manufactured by AOKI OIL INDUSTRIAL Co., LTD. (cetyl alcohol ethylene oxide adduct) (BLAUNON CH-305 and CH-310), polyoxy ethylene stearyl ether manufactured by AOKI OIL INDUSTRIAL Co., LTD. (stearyl alcohol ethylene oxide adduct) (BLAUNON SR-705, SR-707, SR-715, SR-720, SR-730, and SR-750), random polymerization type polyoxy ethylene polyoxypropylene stearyl ether manufactured by AOKI OIL INDUSTRIAL Co., LTD. (BLAUNON SA-50/50 1000R and SA-30/70 2000R), polyoxy ethylene methyl ether (Pluriol A760E) manufactured by BASF, polyoxy ethylene alkyl ether (EMULGEN series) manufactured by Kao Corporation, and the like.

Among these hydrocarbon based surfactants, the internal mold release agent is suitably an alkyl alcohol polyalkylene oxide adduct and more suitably a long chain alkyl alcohol polyalkylene oxide adduct.

The internal mold release agents may be used alone or as a mixture of two or more kinds thereof.

When the photocurable composition according to this embodiment contains the internal mold release agent as the additives (C), the content of the internal mold release agent is, for example, 0.001% by weight or more and 10% by weight or less based on the total amount of the component (A) which is the polymerizable compound. The content is preferably 0.01% by weight or more and 7% by weight or less and more preferably 0.05% by weight or more and 5% by weight or less.

Although a solvent can also be used for the photocurable composition according to this embodiment, it is more suitable that the photocurable composition does not substantially contain a solvent. Herein, the description "not substantially contain a solvent" refers to not containing a solvent other than solvents which are unintentionally contained, such as impurities. More specifically, the content of the solvent of the photocurable composition according to this embodiment is preferably 3% by weight or less and more preferably 1% by weight or less based on the entire photocurable composition, for example. The solvent as used herein refers to a solvent generally used in a photocurable composition or a photoresist. More specifically, the kind of the solvent is not particularly limited insofar as the solvent uniformly dissolves and disperses compounds to be used in the present invention and does not react with the compounds.

In the photocurable composition according to this embodiment, the content of compounds having a molecular weight of 2000 or more is preferably 5% by weight or less and more preferably 3% by weight or less.

The proportions of the component (A) and the component (B) can be determined by analyzing the photocurable composition according to an aspect of the present invention and/or a cured film obtained by curing the same by infrared spectroscopy, ultraviolet-visible spectroscopy, thermal cracking gas chromatography mass spectroscopy, and the like. The proportions of the component (A) and the component (B) in the photocurable composition can also be determined from the proportions of the component (A) and the component (B) in the cured film. Also when the additives (C) are contained, the proportions of the component (A), the component (B), and the additives (C) in the photocurable composition can be similarly determined.

Temperature in Blending Photocurable Composition

When preparing the photocurable composition according to this embodiment, at least the component (A) and the component (B) are mixed and dissolved under predetermined temperature conditions. Specifically, the component (A) and the component (B) are mixed and dissolved in the range of 0° C. or more and 100° C. or less. The same applies to the case of containing the additives (C).

Viscosity of Photocurable Composition

The viscosity at 25° C. of a mixture of the components except the solvent of the photocurable composition according to this embodiment is suitably 1 mPa·s or more and 100 mPa·s or less. The viscosity is more preferably 1 mPa·s or more and 50 mPa·s or less and still more preferably 1 mPa·s or more and 6 mPa·s or less.

By setting the viscosity of the photocurable composition to 100 mPa·s or less, it does not take long time to charge the photocurable composition into concave portions of a fine pattern on a mold when bringing the photocurable composition into contact with the mold. More specifically, a photo-nanoimprinting method can be carried out with high productivity by the use of the photocurable composition according to this embodiment. Moreover, pattern defects due to poor charging are hard to occur.

By setting the viscosity to 1 mPa·s or more, application unevenness is hard to occur when applying the photocurable composition onto a substrate. Furthermore, when bringing the photocurable composition into contact with the mold, the photocurable composition becomes difficult to flow out of an end portion of the mold.

Surface Tension of Photocurable Composition

With respect to the surface tension of the photocurable composition according to this embodiment, the surface tension at 23° C. of a mixture of the components except the solvent is preferably 5 mN/m or more and 70 mN/m or less. The surface tension is more preferably 7 mN/m or more and 35 mN/m or less and still more preferably 10 mN/m or more and 32 mN/m or less. Herein, by setting the surface tension to 5 mN/m or more, it does not take long time to charge the photocurable composition into concave portions of the fine pattern on the mold when bringing the photocurable composition into contact with the mold.

By setting the surface tension to 70 mN/m or less, a cured film to be obtained by curing the photocurable composition is a cured film having surface smoothness.

Impurities Mixed in Photocurable Composition

It is suitable for the photocurable composition according to this embodiment not to contain impurities as much as possible. The impurities described herein refer to substances other than the component (A), the component (B), and the additives (C) mentioned above.

Therefore, the photocurable composition according to this embodiment is suitably one obtained passing through a purification process. Such a purification process, filtration using a filter and the like are suitable.

When performing filtration using a filter, specifically, it is suitable to mix the component (A) and the component (B) mentioned above and the additives to be added mentioned above as necessary, and then perform filtration with a filter having a pore size of 0.001 μm or more and 5.0 μm or less. When performing filtration using a filter, it is more suitable to perform the filtration in many stages or to repeat the filtration many times. The filtered liquid may be filtered again. The filtration may be performed using a plurality of filters different in pore size. As the filter to be used for the filtration, filters formed with polyethylene resin, polypropylene resin, fluororesin, and nylon resin, can be used but the filter is not particularly limited.

By passing through such a purification process, impurities, such as particles, mixed in the photocurable composition, can be removed. This can prevent occurrence of defects in a pattern due to irregularities unintentionally formed in a cured film to be obtained after curing the photocurable composition due to impurities, such as particles.

When using the photocurable composition according to this embodiment for producing a semiconductor integrated circuit, it is suitable to avoid mixing of impurities (metal impurities) containing metal atoms into the photocurable composition as much as possible in order not to hinder the operation of a product. In such a case, the concentration of the metal impurities contained in the photocurable composition is preferably 10 ppm or less and more preferably 100 ppb or less.

Method for Producing Cured Product Pattern

Next, a method for producing a cured product pattern according to this embodiment is described. FIGS. 1A to 1G are cross sectional views specifically illustrating an example of a method for producing a cured product pattern according to this embodiment.

The method for producing a cured product pattern according to this embodiment includes a first process [1] of disposing the photocurable composition according to the above-described embodiment on a substrate, a second process [2] of bringing the photocurable composition and a mold into contact with each other, a third process [4] of irradiating the photocurable composition with light to form a cured product, and a fourth process [5] of separating the cured product obtained by the third process and the mold from each other.

The method for producing a cured product pattern according to this embodiment is a method for producing a cured product pattern using a photo-nanoimprinting method.

A cured product to be obtained by the method for producing a cured product pattern according to this embodiment is suitably a cured product having a pattern of a size of 1 nm or more and 10 mm or less. The cured product is more suitably a cured product having a pattern of a size of 10 nm or more and 100 µm or less. A pattern formation technique of producing a cured product having a nano size (1 nm or more and 100 nm or less) pattern (irregular structure) utilizing light is generally referred to as a photo-nanoimprinting method. The method for producing the cured product pattern according to this embodiment utilizes the photo-nanoimprinting method.

Hereinafter, each process is described.

Disposing Process [1]

Figure 1A:
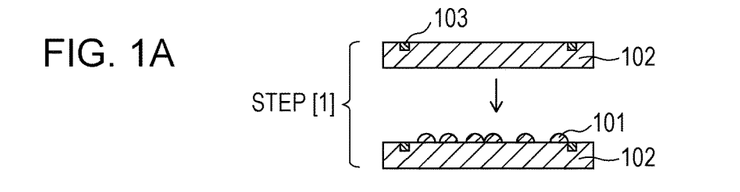
FIG. 1A is a cross sectional view schematically illustrating a method for producing a cured product pattern according to this embodiment.

In this process (disposing process), a photocurable composition 101 according to the embodiment described above is disposed on a substrate 102 (application) to form a coating film as illustrated in FIG. 1A.

The substrate 102 which is a target on which the photocurable composition 101 is to be disposed is a substrate to be processed, and a silicon wafer is usually used.

However, in this embodiment, the substrate 102 is not limited to the silicon wafer. The substrate 102 can be arbitrarily selected from those known as substrates for semiconductor devices, such as aluminum, a titanium tungsten alloy, an aluminum silicon alloy, an aluminum-copper-silicon alloy, silicon oxide, and silicon nitride. For the substrate 102 (substrate to be processed) to be used, a substrate whose adhesiveness with the photocurable composition is increased by surface treatment, such as silane coupling treatment, silazane treatment, and film formation of an organic thin film.

In this embodiment, as a method for disposing the photocurable composition 101 on the substrate 102, an ink jet method, a dip coating method, an air knife coating method, a curtain coating method, a wire bar coating method, a gravure coating method, an extrusion coating method, a spin coating method, a slit scanning method, and the like can be used, for example. In the photo-nanoimprinting method, it is particularly suitable to use the ink jet method. The film thickness of a layer for shape transfer (coating film) varies depending on the intended use and is 0.01 µm or more and 100.0 µm or less, for example.

Pattern Contact Process [2]

Figure 1B:
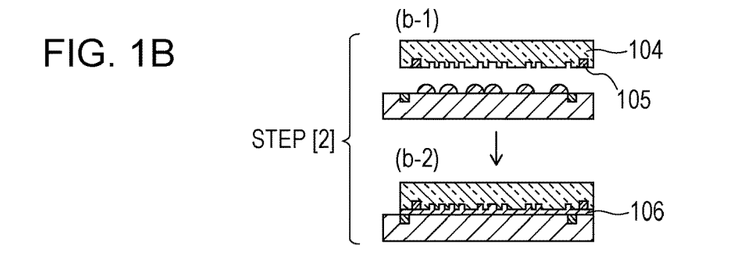
FIG. 1B is a cross sectional view schematically illustrating the method for producing a cured product pattern according to this embodiment.

Next, as illustrated in FIGS. 1B(b-1) and 1B(b-2), a mold 104 having an original pattern for transferring a pattern shape is brought into contact with the coating film containing the photocurable composition 101 formed in the former process (disposing process) (FIG. 1B(b-1)). Thus, the coating film (part) containing the photocurable composition 101 is charged into concave portions of a fine pattern on the surface of the mold 104 to be formed into a coating film 106 charged into the fine pattern of the mold (FIG. 1B(b-2)).

As the mold 104, the mold 104 containing a light transmitting material may be used in consideration of the following process (light irradiation process). Specifically, as the quality of materials configuring the mold 104, glass, quartz, PMMA, light transparent resin, such as polycarbonate resin, transparent metal vapor deposition films, flexible films of polydimethyl siloxane and the like, photocured films, metal films, and the like are suitable. However, when using the light transparent resin as the quality of the material configuring the mold 104, it is necessary to select resin which does not dissolve in the components contained in the photocurable composition 101. Since the thermal expansion coefficient is small and pattern distortion is small, the quality of the material configuring the mold 104 is particularly suitably quartz.

It is suitable for the fine pattern on the surface of the mold 104 to have a pattern height of 4 nm or more and 200 nm or less and an aspect ratio of 1 or more and 10 or less.

In order to increase the releasability of the photocurable composition 101 and the surface of the mold 104, the mold 104 may be surface treated before this process which is the pattern contact process of the photocurable composition 101 and the mold 104. As a surface treatment method, a method including applying a mold release agent to the surface of the mold 104 to form a mold release agent layer is mentioned. Herein, examples of the mold release agent to be applied to the surface of the mold 104 include a silicone mold release agent, a fluorine mold release agent, a hydrocarbon mold release agent, a polyethylene mold release agent, a polypropylene mold release agent, a paraffin mold release agent, a montan mold release agent, a carnauba mold release agent, and the like. For example, commercially-available coating type mold release agents, such as Optool DSX manufactured by Daikin Industries, LTD., and the like can also be suitably used. The mold release agents may be used alone or in combination of two or more kinds thereof. Among the above, a fluorine mold release agent and a hydrocarbon mold release agent are particularly suitable.

In this process (pattern contact process), as illustrated in FIG. 1B(b-1), when bringing the mold 104 and the photocurable composition 101 into contact with each other, the pressure to be applied to the photocurable composition 101 is not particularly limited. The pressure is usually 0 MPa or more 100 MPa or less. The pressure is preferably 0 MPa or more and 50 MPa or less, more preferably 0 MPa or more and 30 MPa or less, and still more preferably 0 MPa or more and 20 MPa or less.

In this process, the time while the mold 104 is brought into contact with the photocurable composition 101 is not particularly limited. The time is usually preferably 0.1 second or more and 600 seconds or less, more preferably 0.1 second or more and 300 seconds or less, still more suitably 0.1 second or more and 180 seconds or less, and particularly preferably 0.1 second or more and 120 seconds or less.

Although this process can be carried out under any condition, such as under an air atmosphere, under a reduced pressure atmosphere, or under an inactive gas atmosphere, it is suitable to carry out this process under a reduced pressure atmosphere or under an inactive gas atmosphere because influence of oxygen or moisture on the curing reaction can be prevented. Specific examples of inactive gas which can be used in carrying out this process under an inactive gas atmosphere include nitrogen, carbon dioxide, helium, argon, and various kinds of fluorocarbon gas, or mixed gas thereof. When carrying out this process under a specific gas atmosphere including the air atmosphere, a suitable pressure is 0.0001 atm or more and 10 atm or less.

The pattern contact process may be carried out under an atmosphere containing condensable gas (hereinafter referred to as a condensable gas atmosphere). In this specification, the condensable gas refers to gas which is condensed and liquefied by the capillary tube pressure generated when the concave portions of the fine pattern formed on the mold 104 and a gap between the mold and the substrate are charged with the gas in the atmosphere together with the coating film (part) 106. The condensable gas is present as gas in the atmosphere before the photocurable composition 101 (layer for shape transfer) and the mold 104 are brought into contact with each other in the pattern contact process (FIG. 1B(b-1)).

When the pattern contact process is carried out under the condensable gas atmosphere, air bubbles disappear due to the liquefying of the gas charged into the concave portions of the fine pattern, and therefore the chargeability is excellent. The condensable gas may be dissolved into the photocurable composition 101.

The boiling point of the condensable gas is not limited insofar as the boiling point is equal to or less than the atmospheric temperature in the pattern contact process and is preferably $-10°$ C. to $23°$ C. and more preferably $10°$ C. to $23°$ C. When the boiling point is in the ranges above, the chargeability is more excellent.

The steam pressure of the condensable gas at the atmospheric temperature in the pattern contact process is not limited insofar as the pressure is equal to or less than the mold pressure when performing imprinting in the pattern contact process and is suitably 0.1 to 0.4 MPa. When the steam pressure is in the range above, the chargeability is more excellent. When the steam pressure at the atmospheric temperature is larger than 0.4 MPa, there is a tendency that the effect of disappearance of air bubbles cannot be sufficiently acquired. On the other hand, when the steam pressure at the atmospheric temperature is smaller than 0.1 MPa, the pressure needs to decrease, so that there is a tendency that a device becomes complicated.

The atmospheric temperature in the pattern contact process is not particularly limited and is suitably $20°$ C. to $25°$ C.

Specific examples of the condensable gas include Freon, such as chlorofluorocarbon (CFC), such as trichlorofluoromethane, fluorocarbon (FC), hydrofluorocarbon (HFC), such as hydrochlorofluorocarbon (HCFC) and 1,1,1,3,3-pentafluoropropane ($CHF_2CH_2 CF_3$, HFC-245fa, and PFP), and hydrofluoroether (HFE), such as pentafluoroethyl methyl ether ($CF_3CF_2OCH_3$, HFE-245mc).

Among the above, from the viewpoint that the chargeability at an atmospheric temperature of $20°$ C. to $25°$ C. in the pattern contact process is excellent, 1,1,1,3,3-pentafluoropropane (Steam pressure at $23°$ C. of 0.14 MPa, Boiling point of $15°$ C.), trichlorofluoromethane (Steam pressure at $23°$ C. of 0.1056 MPa. Boiling point of $24°$ C.), and pentafluoroethyl methyl ether are suitable. Furthermore, from the viewpoint that safety is excellent, 1,1,1,3,3-pentafluoropropane is particularly suitable.

The condensable gas may be used alone or as a mixture of two or more kinds thereof. The condensable gas mentioned above may be mixed with non-condensable gas, such as air, nitrogen, carbon dioxide, helium, and argon, for use. As the non-condensable gas to be mixed with the condensable gas, helium is suitable from the viewpoint of chargeability. Helium can penetrate through the mold 104. Therefore, when the concave portions of the fine pattern formed on the mold 104 are charged with the gas (condensable gas and helium) in the atmosphere together with the coating film (part) 106 in the pattern contact process, the condensable gas is liquefied and also helium penetrates through the mold 104.

Positioning Process [3]

Figure 1C:
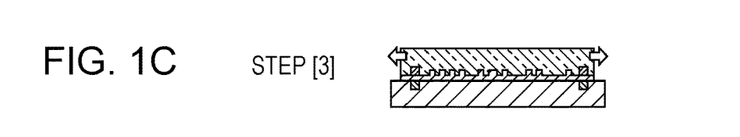
FIG. 1C is a cross sectional view schematically illustrating the method for producing a cured product pattern according to this embodiment.

Next, the position(s) of the mold and/or the substrate to be processed are/is adjusted in such a manner that a mold side positioning mark 105 and a positioning mark 103 of the substrate to be processed are in agreement with each other as necessary as illustrated in FIG. 1C. The positioning process is not indispensable and may be skipped depending on the intended use.

Light Irradiation Process [4]

Figure 1D:
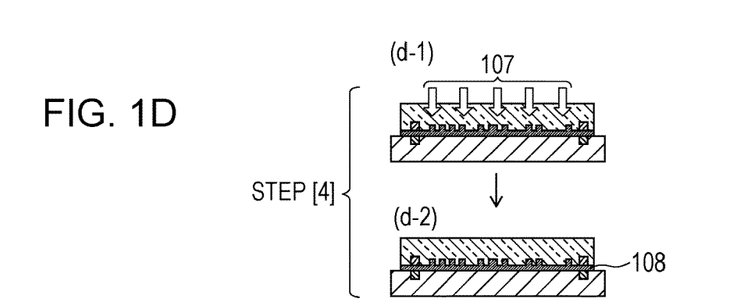
FIG. 1D is a cross sectional view schematically illustrating the method for producing a cured product pattern according to this embodiment.

Next, the contact portion with the mold 104 of the photocurable composition 101 is irradiated with light through the mold 104 as illustrated in FIGS. 1D(d-1) and 1D(d-2) in the state where the positions are made in agreement with each other in the process [3]. More specifically, the coating film 106 charged into the fine pattern of the mold 104 is irradiated with light through the mold 104 (FIG. 1D(d-1)). Thus, the coating film 106 charged into the fine pattern of the mold 104 is cured by the irradiated light to be formed into a cured film 108 (FIG. 1D(d-2)).

Herein, the light irradiating the photocurable composition 101 configuring the coating film 106 charged into the fine pattern of the mold 104 is selected according to the sensitivity wavelength of the photocurable composition 101. Specifically, it is suitable to select and use ultraviolet light which have a wavelength of 150 nm or more and 400 nm or less, X-rays, electron beams, and the like as appropriate.

Among the above, as the light (irradiation light 107) irradiating the photocurable composition 101 is particularly suitably ultraviolet light. This is because commercially available items as a curing assistant (photopolymerization initiator) are almost compounds having sensitivity to ultraviolet light. Herein, examples of a light source emitting ultraviolet light include, for example, a high-pressure mercury lamp, an ultrahigh pressure mercury lamp, a low-pressure mercury lamp, a Deep-UV lamp, a carbon arc light, a chemical lamp, a metal halide lamp, a xenon lamp, a KrF excimer laser, an ArF excimer laser, an $F_2$ excimer laser, and the like and an ultrahigh pressure mercury lamp is particularly suitable. The number of the light sources to be used may be 1 or 2 or more. When performing light irradiation, the entire surface of the coating film 106 charged into the fine pattern of the mold may be irradiated with light or only a partial region may be irradiated with light.

The light may be intermittently emitted to the entire region on the substrate several times or may be continuously emitted to the entire region. Furthermore, a partial region A may be irradiated with light in a first irradiation process, and then a region B different from the region A may be irradiated with light in a second irradiation process.

Mold Release Process [5]

Figure 1E:
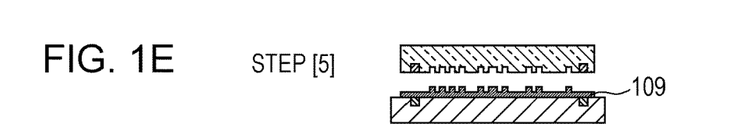
FIG. 1E is a cross sectional view schematically illustrating the method for producing a cured product pattern according to this embodiment.

Next, the cured film 108 and the mold 104 are separated from each other. At this time, a cured film 109 having a predetermined pattern shape is formed on the substrate 102.

In this process (mold release process), as illustrated in FIG. 1E, the cured film 108 and the mold 104 are separated from each other, and then the cured film 109 having a pattern shape serving as a reversal pattern of the fine pattern formed on the mold 104 in the process [4] (light irradiation process) is obtained.

When the pattern contact process is carried out under a condensable gas atmosphere, the condensable gas is evaporated in connection with a reduction in the pressure of the interface where the cured film 108 and the mold 104 contact, when separating the cured film 108 and the mold 104 from each other in the mold release process. Thus, there is a tendency that an effect of reducing the mold releasing force which is the force of separating the cured film 108 and the mold 104 from each other is demonstrated.

A method for separating the cured film 108 and the mold 104 from each other is not particularly limited insofar as the cured film 108 is not partially physically damaged in the separation and various conditions and the like are not particularly limited. For example, the separation may be performed by fixing the substrate 102 (substrate to be processed) and moving the mold 104 in such a manner as to be away from the substrate 102. Or, the separation may be performed by fixing the mold 104 and moving the substrate 102 in such a manner as to be away from the mold. Or, the separation may be performed by pulling both the mold 104 and the substrate 102 in the opposite directions.

By a series of processes (manufacturing process) having the above-described process [1] to process [5], a cured film having a desired irregular pattern shape (pattern shape following the irregular shape of the mold 104) at a desired position can be obtained. The obtained cured film can also be utilized as optical members (including the case of using the cured film as one member of optical members), such as a Fresnel lens and a diffraction grating, for example. In such a case, an optical member at least having the substrate 102 and the cured film 109 having a pattern shape disposed on the substrate 102 can be obtained.

In the method for producing the film having a pattern shape of this embodiment, the repeating unit (shot) including the process [1] to the process [5] can be repeated several times on the same substrate to be processed. By repeating the repeating unit (shot) including the process [1] to the process [5] several times, a cured film having a plurality of desired irregular pattern shapes (pattern shape following the irregular shape of the mold 104) at desired positions of a substrate to be processed can be obtained.

Remaining Film Removal Process [6] of Partially Removing Cured Film

Figure 1F:
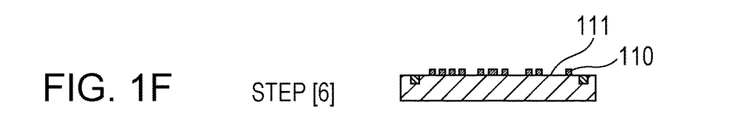
FIG. 1F is a cross sectional view schematically illustrating the method for producing a cured product pattern according to this embodiment.
Figure 1G:
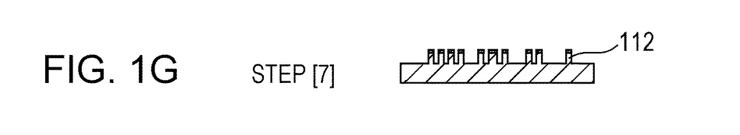
FIG. 1G is a cross sectional view schematically illustrating the method for producing a cured product pattern according to this embodiment.

Although the cured film obtained by the mold release process which is the process [5] has a specific pattern shape, the cured film sometimes partially remains also in a region other than the region where the pattern shape is formed (hereinafter such a cured film is referred to as a "remaining film"). In such a case, as illustrated in FIG. 1F, the cured film (remaining film) in a region to be removed of the cured film having the obtained pattern shape is removed. Thus, a cured product pattern 110 having a desired irregular pattern shape (pattern shape following the irregular shape of the mold 104) can be obtained.

Herein, examples of a method for removing the remaining film include a method including removing the cured films (remaining film) which are concave portions of the cured film 109 by a method, such as etching, and then exposing the surface of the substrate 102 in the concave portions of the pattern of the cured film 109, for example.

When removing the cured films in the concave portions of the cured film 109 by etching, a specific method therefor is not particularly limited and knowns methods, e.g., dry etching, can be used. For the dry etching, known dry etching devices can be used. Source gas in the dry etching is selected as appropriate according to the elemental composition of the cured film to be subjected to etching and halogen gas, such as $CF_4$, $C_2F_6$, $C_3F_8$, $CCl_2F$, $CC_4$, $CBrF_3$, $BCl_3$, $PCl_3$, $SF_6$, and $Cl_2$, gas containing oxygen atoms, such as $O_2$, CO, and $CO_2$, inactive gas, such as He, $N_2$, and Ar, gas, such as $H_2$ and $NH_3$, and the like can be used. The gas mentioned above can also be mixed for use.

By the manufacturing process including the above-described process [1] to process [6], the cured product pattern 110 having a desired irregular pattern shape (pattern shape following the irregular shape of the mold 104) at a desired position can be obtained and articles having the cured film pattern can be obtained. Furthermore, when processing the substrate 102 utilizing the obtained cured product pattern 110, a substrate processing process (process [7]) described later is performed.

On the other hand, by utilizing the obtained cured product pattern 110 as optical members (including a case of using the cured pattern 110 as one member of optical members), such as a diffraction grating and a polarizing plate, an optical component can also be obtained. In such a case, an optical component at least having the substrate 102 and the cured product pattern 110 disposed on the substrate 102 can be obtained.

Substrate Processing Process [7]

The cured product pattern 110 having an irregular pattern shape to be obtained by the method for producing a cured product pattern according to this embodiment can also be utilized as, for example, a film for interlayer insulation film contained in electronic components typified by semiconductor elements, such as LSI, a system LSI, DRAM, SDRAM, RDRAM, and D-RDRAM. The cured product pattern 110 can also be utilized as a resist film in producing a semiconductor element.

When utilizing the cured product pattern 110 as a resist film, a part of the substrate (region denoted by the reference numeral 111 in FIG. 1G) whose surface is exposed in the etching process which is the process [6] is subjected to etching or ion implantation. In this operation, the cured film pattern 110 functions as an etching mask. In addition thereto, by forming an electronic component, a circuit structure 112 (FIG. 1G) based on the pattern shape of the cured product pattern 110 can be formed on the substrate 102. Thus, a circuit board to be utilized in a semiconductor element and the like can be manufactured. Moreover, by connecting the circuit board and a circuit control mechanism of the circuit board and the like, electronic devices, such as a display, a camera, and a medical device, can also be formed.

Similarly, by performing etching or ion implantation utilizing the cured product pattern 110 as a resist film, an optical component can also be obtained.

When producing a substrate with a circuit and an electronic component, the cured product pattern 110 may be finally removed from the processed substrate, but a configuration in which the cured pattern 10 is left as a member configuring the element may be acceptable.

EXAMPLES

Hereinafter, the present invention is described in more detail with referent to Examples but the technical scope of the present invention is not limited to Examples described below.

Comparative Example 1

(1) Preparation of Photocurable Composition for Nanoimprinting (b-1)

Components (A) and a component (B) shown below were blended, and then the mixture was filtered with a 0.2 μm ultrahigh molecular weight polyethylene filter to thereby prepare a photocurable composition for nanoimprinting (b-1) of Comparative Example 1.

(1-1) Components (A): 100 Parts by Weight in Total

<A-1> Benzyl acrylate (manufactured by Osaka Organic Chemical Industry Co., Ltd. Trade-name: V#160): 50 parts by weight <A-2> Neopentyl glycol diacrylate (manufactured by Kyoeisha Chemical Co., Ltd., Trade-name: NP-A): 50 parts by weight (1-2) Component (B): 3 Parts by Weight in Total <B-1> Lucirin TPO (manufactured by BASF): 3 parts by weight (2) Measurement of Viscosity of Photocurable Composition for Nanoimprinting (b-1)

The viscosity at 25° C. of the photocurable composition for nanoimprinting (b-1) was 3.33 mPa·s as measured using a cone-and-plate rotational viscometer RE-85L (manufactured by Toki Sangyo Co., Ltd.).

(3) Production of Cured Film of Photocurable Composition for Nanoimprinting (b-1)

On a silicon wafer on which a 60 nm thick adhesion promoting layer was formed as an adhesion layer, 2 μL of the prepared photocurable composition for nanoimprinting (b-1) was added dropwise. Thereafter, a 1 mm thick silica glass was placed from the top, and then a square region having one side of 25 mm was charged with the photocurable composition for nanoimprinting (b-1).

Next, light emitted from a UV light source having an ultrahigh pressure mercury lamp, and then passing through an interference filter was emitted to the coating film for 200 seconds through the silica glass. As the interference filter, VPF-25C-10-15-31300 (manufactured by SIGMAKOKI Co., LTD.) was used. As the wavelength of the ultraviolet light which was the irradiation light at this time, a single wavelength light of 313±5 nm was used and the illuminance was set to 1 mW/cm$^2$.

After the light irradiation, the silica glass was separated, and then a cured film of the photocurable composition for nanoimprinting b-1 having an average film thickness of 3.2 μm was obtained on the silicon wafer.

(4) Measurement of Dry Etching Rate of Cured Film of Photocurable Composition for Nanoimprinting (b-1)

The cured film (b-1) was subjected to dry etching for 500 seconds using a high density plasma etching device NE-550 manufactured by ULVAC, using etching gas, and setting the flow rate of the etching gas to $CH_4/CHF_3$=50 sccm/50 sccm. The dry etching rate (nm/s) was calculated by measuring the film thickness which decreased by the dry etching. The dry etching rate indicates that the dry etching resistance is higher when the dry etching value is smaller.

Comparative Example 2

(1) Preparation of Photocurable Composition for Nanoimprinting (b-2)

Components (A) and a component (B) shown below were blended, and then the mixture was filtered with a 0.2 μm ultrahigh molecular weight polyethylene filter to thereby prepare a photocurable composition for nanoimprinting (b-2) of Comparative Example 2.

(1-1) Components (A): 100 Parts by Weight in Total

<A-1> Benzyl acrylate (manufactured by Osaka Organic Chemical Industry Co., Ltd. Trade-name: V#160): 50 parts by weight <A-2>1,6-hexanediol diacrylate (Osaka Organic Chemical Industry Co., Ltd. make and Trade name: V#230): 50 parts by weight (1-2) Component (B): 3 Parts by Weight in Total <B-1> Lucirin TPO (manufactured by BASF): 3 parts by weight (2) Measurement of Viscosity of Photocurable Composition for Nanoimprinting (b-2)

The viscosity at 25° C. of the photocurable composition for nanoimprinting (b-2) was 3.43 mPa·s as measured in the same manner as in Comparative Example 1.

(3) Production of Cured Film of Photocurable Composition for Nanoimprinting (b-2)

A cured film of the photocurable composition for nanoimprinting (b-2) having an average film thickness of 3.2 m was obtained on a silicon wafer in the same manner as in Comparative Example 1.

(4) Measurement of Dry Etching Rate of Cured Film of Photocurable Composition for Nanoimprinting (b-2)

The cured film of (b-2) was subjected to dry etching for 500 seconds in the same manner as in Comparative Example 1, and then the dry etching rate was calculated as a relative value when the dry etching rate of the cured film (b-1) was 100. The results are shown in Table 1.

Comparative Example 3

(1) Preparation of Photocurable Composition for Nanoimprinting (b-3)

Components (A) and a component (B) shown below were blended, and then the mixture was filtered with a 0.2 μm ultrahigh molecular weight polyethylene filter to thereby prepare a photocurable composition for nanoimprinting (b-3) of Comparative Example 3.

(1-1) Components (A): 100 Parts by Weight in Total

<A-1> Benzyl acrylate (manufactured by Osaka Organic Chemical Industry Co., Ltd. Trade-name: V#160): 50 parts by weight <A-2>1,10-decanediol diacrylate (manufactured by Shin-Nakamura Chemical, Trade name: A-DOD-N): 50 parts by weight (1-2) Component (B): 3 Parts by Weight in Total <B-1> Lucirin TPO (manufactured by BASF): 3 parts by weight (2) Measurement of Viscosity of Photocurable Composition for Nanoimprinting (b-3)

The viscosity at 25° C. of the photocurable composition for nanoimprinting (b-3) was 3.84 mPa·s as measured in the same manner as in Comparative Example 1.

(3) Production of Cured Film of Photocurable Composition for Nanoimprinting (b-3)

A cured film of the photocurable composition for nanoimprinting (b-3) having an average film thickness of 3.2 μm was obtained on a silicon wafer in the same manner as in Comparative Example 1.

(4) Measurement of Dry Etching Rate of Cured Film of Photocurable Composition for Nanoimprinting (b-3)

The cured film of (b-3) was subjected to dry etching for 500 seconds in the same manner as in Comparative Example 1, and then the dry etching rate was calculated as a relative value when the dry etching rate of the cured film (b-1) was 100. The results are shown in Table 1.

Comparative Example 4

(1) Preparation of Photocurable Composition for Nanoimprinting (b-4)

Components (A) and a component (B) shown below were blended, and then the mixture was filtered with a 0.2 μm ultrahigh molecular weight polyethylene filter to thereby prepare a photocurable composition for nanoimprinting (b-4) of Comparative Example 4.

(1-1) Components (A): 100 Parts by Weight in Total
<A-1> Benzyl acrylate (manufactured by Osaka Organic Chemical Industry Co., Ltd. Trade-name: V#160): 50 parts by weight
<A-2> Neopentyl glycol diacrylate (manufactured by Kyoeisha Chemical Co., Ltd., Trade-name: NP-A): 25 parts by weight
<A-3> Dimethylol tricyclodecane diacrylate (manufactured by Kyoeisha Chemical Co., Ltd., Trade-name: DCP-A): 25 parts by weight
(1-2) Component (B): 3 Parts by Weight in Total
<B-1> Lucirin TPO (manufactured by BASF): 3 parts by weight (2) Measurement of Viscosity of Photocurable Composition for Nanoimprinting (b-4)

The viscosity at 25° C. of the photocurable composition for nanoimprinting (b-4) was 5.37 mPa·s as measured in the same manner as in Comparative Example 1.

(3) Production of Cured Film of Photocurable Composition for Nanoimprinting (b-4)

A cured film of the photocurable composition for nanoimprinting (b-4) having an average film thickness of 3.2 m was obtained on a silicon wafer in the same manner as in Comparative Example 1.

(4) Measurement of Dry Etching Rate of Cured Film of Photocurable Composition for Nanoimprinting (b-4)

The cured film (b-4) was subjected to dry etching for 500 seconds in the same manner as in Comparative Example 1, and then the dry etching rate was calculated as a relative value when the dry etching rate of the cured film (b-1) was 100. The results are shown in Table 1.

Comparative Example 5

(1) Preparation of Photocurable Composition for Nanoimprinting (b-5)

Components (A) and a component (B) shown below were blended, and then the mixture was filtered with a 0.2 μm ultrahigh molecular weight polyethylene filter to thereby prepare a photocurable composition for nanoimprinting (b-5) of Comparative Example 5.

(1-1) Components (A): 100 Parts by Weight in Total
<A-1> Benzyl acrylate (manufactured by Osaka Organic Chemical Industry Co., Ltd. Trade-name: V#160): 50 parts by weight
<A-2> Dimethylol tricyclodecane diacrylate (manufactured by Kyoeisha Chemical Co., Ltd., Trade-name: DCP-A): 50 parts by weight
(1-2) Component (B): 3 Parts by Weight in Total
<B-1> Lucirin TPO (manufactured by BASF): 3 parts by weight (2) Measurement of Viscosity of Photocurable Composition for Nanoimprinting (b-5)

The viscosity at 25° C. of the photocurable composition for nanoimprinting (b-5) was 9.30 mPa·s as measured in the same manner as in Comparative Example 1.

(3) Production of Cured Film of Photocurable Composition for Nanoimprinting (b-5)

A cured film of the photocurable composition for nanoimprinting (b-5) having an average film thickness of 3.2 m was obtained on a silicon wafer in the same manner as in Comparative Example 1.

(4) Measurement of Dry Etching Rate of Cured Film of Photocurable Composition for Nanoimprinting (b-5)

The cured film (b-5) was subjected to dry etching for 500 seconds in the same manner as in Comparative Example 1, and then the dry etching rate was calculated as a relative value when the dry etching rate of the cured film (b-1) was 100. The results are shown in Table 1.

Example 1

(1) Preparation of Photocurable Composition for Nanoimprinting (a-1)

Components (A) and a component (B) shown below were blended, and then the mixture was filtered with a 0.2 μm ultrahigh molecular weight polyethylene filter to thereby prepare a photocurable composition for nanoimprinting (a-1) of Example 1.

(1-1) Components (A): 100 Parts by Weight in Total
<A-1> Benzyl acrylate (manufactured by Osaka Organic Chemical Industry Co., Ltd. Trade-name: V#160): 50 parts by weight
<A-6> Phenylethylene glycol diacrylate (PhEDA): 50 parts by weight
(1-2) Component (B): 3 Parts by Weight in Total
<B-1> Lucirin TPO (manufactured by BASF): 3 parts by weight (2) Measurement of Viscosity of Photocurable Composition for Nanoimprinting (a-1)

The viscosity at 25° C. of the photocurable composition for nanoimprinting (a-1) was 5.8 mPa·s as measured in the same manner as in Comparative Example 1.

(3) Production of Cured Film of Photocurable Composition for Nanoimprinting (a-1)

A cured film of the photocurable composition for nanoimprinting (a-1) having an average film thickness of 3.2 μm was obtained on a silicon wafer in the same manner as in Comparative Example 1.

(4) Measurement of Dry Etching Rate of Cured Film of Photocurable Composition for Nanoimprinting (a-1)

The cured film (a-1) was subjected to dry etching for 500 seconds in the same manner as in Comparative Example 1, and then the dry etching rate was calculated as a relative value when the dry etching rate of the cured film (b-1) was 100. The results are shown in Table 1.

Example 2

(1) Preparation of Photocurable Composition for Nanoimprinting (a-2)

Components (A) and a component (B) shown below were blended, and then the mixture was filtered with a 0.2 μm ultrahigh molecular weight polyethylene filter to thereby prepare a photocurable composition for nanoimprinting (a-2) of Example 2.

(1-1) Components (A): 100 Parts by Weight in Total
<A-1> Benzyl acrylate (manufactured by Osaka Organic Chemical Industry Co., Ltd. Trade-name: V#160): 75 parts by weight
<A-7> 2-phenyl propane-1, 3-diyldiacrylate (PhPDA): 25 parts by weight
(1-2) Component (B): 3 Parts by Weight in Total
<B-1> Lucirin TPO (manufactured by BASF): 3 parts by weight (2) Measurement of Viscosity of Photocurable Composition for Nanoimprinting (a-2)

The viscosity at 25° C. of the photocurable composition for nanoimprinting (a-2) was 3.67 mPa·s as measured in the same manner as in Comparative Example 1.

(3) Production of Cured Film of Photocurable Composition for Nanoimprinting (a-2)

A cured film of the photocurable composition for nanoimprinting (a-2) having an average film thickness of 3.2 μm was obtained on a silicon wafer in the same manner as in Comparative Example 1.

(4) Measurement of Dry Etching Rate of Cured Film of Photocurable Composition for Nanoimprinting (a-2)

The cured film (a-2) was subjected to dry etching for 500 seconds in the same manner as in Comparative Example 1, and then the dry etching rate was calculated as a relative value when the dry etching rate of the cured film (b-1) was 100. The results are shown in Table 1.

Example 3

(1) Preparation of Photocurable Composition for Nanoimprinting (a-3)

Components (A) and a component (B) shown below were blended, and then the mixture was filtered with a 0.2 μm ultrahigh molecular weight polyethylene filter to thereby prepare a photocurable composition for nanoimprinting (a-3) of Example 3.

(1-1) Components (A): 100 Parts by Weight in Total
<A-1> Benzyl acrylate (manufactured by Osaka Organic Chemical Industry Co., Ltd. Trade-name: V#160): 50 parts by weight
<A-7> 2-phenyl propane-1,3-diyldiacrylate (PhPDA): 50 parts by weight
(1-2) Component (B): 3 Parts by Weight in Total
<B-1> Lucirin TPO (manufactured by BASF): 3 parts by weight (2) Measurement of Viscosity of Photocurable Composition for Nanoimprinting (a-3)

The viscosity at 25° C. of the photocurable composition for nanoimprinting (a-3) was 6.14 mPa·s as measured in the same manner as in Comparative Example 1.

(3) Production of Cured Film of Photocurable Composition for Nanoimprinting (a-3)

A cured film of the photocurable composition for nanoimprinting (a-3) having an average film thickness of 3.2 μm was obtained on a silicon wafer in the same manner as in Comparative Example 1.

(4) Measurement of Dry Etching Rate of Cured Film of Photocurable Composition for Nanoimprinting (a-3)

The cured film (a-3) was subjected to dry etching for 500 seconds in the same manner as in Comparative Example 1, and then the dry etching rate was calculated as a relative value when the dry etching rate of the cured film (b-1) was 100. The results are shown in Table 1.

Summary of Comparative Examples and Examples

The results obtained in Comparative Examples 1 to 5 and Examples 1 to 3 are collectively shown in Table (1).

TABLE 1

| | Composition Name | Viscosity (mPa·s) | Dry etching rate* |
|---|---|---|---|
| Comp. Ex. 1 | b-1 | 3.33 | 100 |
| Comp. Ex. 2 | b-2 | 3.43 | 93 |
| Comp. Ex. 3 | b-3 | 3.84 | 89 |
| Comp. Ex. 4 | b-4 | 5.37 | 91 |
| Comp. Ex. 5 | b-5 | 9.30 | 82 |
| Ex. 1 | a-1 | 5.80 | 85 |
| Ex. 2 | a-2 | 3.67 | 87 |
| Ex. 3 | a-3 | 6.14 | 86 |

*Relative value when the dry etching rate of the cured film (b-1) was 100

As shown in Table (1), the compositions (b-1) to (b-4) of Comparative Examples 1 to 4 had relatively low viscosity but had relatively low dry etching resistance. Moreover, the composition (b-5) of Comparative Example 5 had high dry etching resistance but high viscosity.

On the other hand, the compositions (a-1), (a-2), and (a-3) of Examples 1 to 3 showed good balance between viscosity and dry etching resistance. More specifically, the nanoimprinting method employing the photocurable compositions for nanoimprinting of Examples 1 to 3 is expected to have high productivity and also high yield.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A photocurable composition comprising:
a polymerizable compound; and
a photopolymerization initiator,
the photocurable composition containing a compound represented by Formula (1) shown below as the polymerizable compound wherein, in Formula (1), Ar represents a monovalent aromatic group which may have a substituent, $R_1$ represents a hydrogen atom, $R_2$ represents an alkyl group having (m+n) valences which may have a substituent, m is an integer of 2 or more, and n is an integer of 1 or more.

2. The photocurable composition according to claim 1, wherein a viscosity at 25° C. of the photocurable composition is 1 mPa·s or more and 100 mPa·s or less.

3. The photocurable composition according to claim 1, further comprising a monofunctional (meth)acryl compound as the polymerizable compound.

4. The photocurable composition according to claim 1, comprising an acyl phosphine oxide polymerization initiator as the photopolymerization initiator.

5. The photocurable composition according to claim 1, wherein a content of a solvent of the photocurable composition is 3% by weight or less based on the entire photocurable composition.

6. The photocurable composition according to claim 1, wherein the photocurable composition is a photocurable composition for nanoimprinting.

7. The photocurable composition according to claim 1, comprising a compound represented by Formula (2) shown below as the polymerizable compound (2)

8. The photocurable composition according to claim 1, comprising a compound represented by Formula (3) as the polymerizable compound (3)

9. A method for producing a cured product pattern comprising:
a first step of disposing the photocurable composition according to claim 1 a substrate;
a second step of bringing the photocurable composition and a mold into contact with each other;
a third step of irradiating the photocurable composition with light to form a cured product; and
a fourth step of separating the cured product and the mold from each other.

10. The method for producing a cured product pattern according to claim 9, wherein the first step to the fourth step are performed several times in different regions on the substrate.

11. The method for producing a cured product pattern according to claim 9, wherein a material of the surface of the mold is quartz.

12. The method for producing a cured product pattern according to claim 9, wherein the third step is a step of irradiating the photocurable composition through the mold having a pattern on a surface.

13. The method for producing a cured product pattern according to claim 9, wherein the second step is performed under an atmosphere containing condensable gas.

14. The method for producing a cured product pattern according to claim 9, wherein the second step is performed under an atmosphere of mixed gas of the condensable gas and non-condensable gas.

15. The method for producing a cured product pattern according to claim 14, wherein the non-condensable gas is helium.

16. The method for producing a cured product pattern according to claim 13, wherein the condensable gas is 1,1,1,3, 3-pentafluoropropane.

17. A method for producing an optical component comprising:
a step of obtaining a cured product pattern by the method for producing a cured product pattern according to claim 9.

18. A method for producing a circuit board comprising:
a step of obtaining a cured product pattern by the method for producing a cured product pattern according to claim 9; and
a step of subjecting a substrate to etching or ion implantation using the obtained cured product pattern as a mask.

19. The method for producing a circuit board according to claim 18, wherein the circuit board is a circuit board to be utilized in a semiconductor element.

20. The photocurable composition according to claim 1, wherein
$R_2$ represents ethylene group or propylene group, and n is 1.

21. A photocurable composition comprising:
a polymerizable compound; and
a photopolymerization initiator,
wherein a viscosity at 25° C. of the photocurable composition is 1 mPa·s or more and 100 mPa·s or less, and
the photocurable composition containing a compound represented by General
Formula (1) shown below as the polymerizable compound (1)

wherein, in Formula (1), Ar represents a monovalent aromatic group which may have a substituent, R1 represents an alkyl group which may have a substituent or a hydrogen atom, R2 represents an alkyl group having (m+n) valences which may have a substituent, m is an integer of 2 or more, and n is an integer of 1 or more.

* * * * *